(12) United States Patent
Hsu et al.

(10) Patent No.: US 9,343,387 B2
(45) Date of Patent: May 17, 2016

(54) PACKAGE ON PACKAGE STRUCTURE AND FABRICATION METHOD THEREOF

(71) Applicant: Siliconware Precision Industries Co., Ltd., Taichung (TW)

(72) Inventors: Chu-Chi Hsu, Taichung (TW);
Lung-Yuan Wang, Taichung (TW);
Cheng-Chia Chiang, Taichung (TW);
Chia-Kai Shih, Taichung (TW);
Shu-Huei Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/452,871

(22) Filed: Aug. 6, 2014

(65) Prior Publication Data
US 2015/0255360 A1    Sep. 10, 2015

(30) Foreign Application Priority Data

Mar. 5, 2014    (TW) ................ 103107386 A (51) Int. Cl.
*H01L 23/31*    (2006.01)
*H01L 25/10*    (2006.01)
(Continued)

(52) U.S. Cl.
CPC ...... *H01L 23/3128* (2013.01); *H01L 23/49811* (2013.01); *H01L 23/49816* (2013.01); *H01L 24/16* (2013.01); *H01L 24/81* (2013.01); *H01L 25/0657* (2013.01); *H01L 25/105* (2013.01); *H01L 25/50* (2013.01); *H01L 24/13* (2013.01); *H01L 24/32* (2013.01); *H01L 24/73* (2013.01); *H01L 24/92* (2013.01); *H01L 25/16* (2013.01); *H01L 2224/0401* (2013.01); *H01L 2224/131* (2013.01); *H01L 2224/13147* (2013.01); *H01L 2224/13186* (2013.01); *H01L 2224/16168* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/92125* (2013.01);
(Continued)

(58) Field of Classification Search
CPC ............... H01L 2924/014; H01L 2224/73204; H01L 2224/13147; H01L 2224/32145; H01L 24/13; H01L 2224/81; H01L 24/81; H01L 23/49816; H01L 24/11; H01L 25/0657; H01L 23/3128; H01L 2225/06513; H01L 2224/11
See application file for complete search history.

(56) References Cited

U.S. PATENT DOCUMENTS

| | | | |
|---|---|---|---|
| 2008/0073769 A1* | 3/2008 | Wu | H01L 21/56 257/686 |
| 2011/0068453 A1* | 3/2011 | Cho | H01L 21/565 257/686 |

(Continued)

*Primary Examiner* — Roy Potter
(74) *Attorney, Agent, or Firm* — Mintz Levin Cohn Ferris Glovsky and Popeo, P.C.; Peter F. Corless; Steven M. Jensen (57) ABSTRACT

A package on package (PoP) structure is provided, which includes: a packaging substrate having a plurality of conductive bumps, wherein each of the conductive bumps has a metal ball and a solder material covering the metal ball; and an electronic element having a plurality of conductive posts, wherein the electronic element is stacked on the packaging substrate by correspondingly bonding the conductive posts to the conductive bumps, and each of the conductive posts and the corresponding conductive bump form a conductive element. The present invention facilitates the stacking process through butt joint of the conductive posts and the metal balls of the conductive bumps.

16 Claims, 5 Drawing Sheets

(51) Int. Cl.
   H01L 23/498 (2006.01)
   H01L 25/065 (2006.01)
   H01L 25/00 (2006.01)
   *H01L 23/00* (2006.01)
   *H01L 25/16* (2006.01)
(52) U.S. Cl.
   CPC ........... *H01L2225/06517* (2013.01); *H01L 2225/1017* (2013.01); *H01L 2225/1023* (2013.01); *H01L 2225/1041* (2013.01); *H01L 2225/1058* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01); *H01L 2924/19102* (2013.01); *H01L 2924/19103* (2013.01); *H01L 2924/3511* (2013.01); *H01L 2924/37001* (2013.01)

(56) References Cited

U.S. PATENT DOCUMENTS

| 2011/0117700 | A1* | 5/2011 | Weng | H01L 21/56 438/109 |
| 2012/0267782 | A1* | 10/2012 | Chen | H01L 23/3128 257/738 |
| 2014/0063768 | A1* | 3/2014 | Tanaka | H01L 23/3121 361/784 |

* cited by examiner

PACKAGE ON PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103107386, filed Mar. 5, 2014, the entire contents of which is incorporated herein by reference.

BACKGROUND OF THE INVENTION

1. Field of the Invention

The present invention relates to package on package (PoP) structures, and more particularly, to a PoP structure and a fabrication method thereof.

2. Description of Related Art

Along with the rapid development of portable electronic products, various package types such as PoP structures have been developed to meet high density, high performance and miniaturization requirements.

Figure 1:
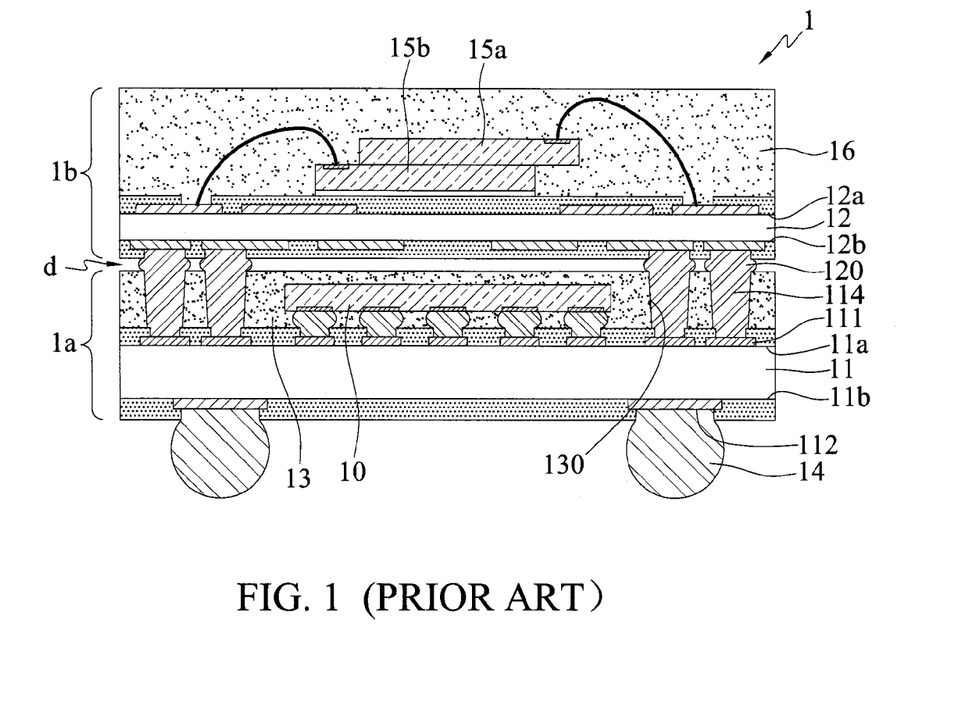
FIG. 1 is a schematic cross-sectional view of a conventional PoP structure.

FIG. 1 is a schematic cross-sectional view of a conventional PoP structure 1. Referring to FIG. 1, the PoP structure 1 has a first package structure 1a and a second package structure 1b stacked on the first package structure 1a.

The first package structure 1a has a first substrate 11 having a first surface 11a and a second surface 11b opposite to the first surface 11a. The first surface 11a of the first substrate 11 has a plurality of conductive pads 111 and the second surface 11b of the first substrate 11 has a plurality of conductive pads 112. A first electronic element 10 is flip-chip bonded to the first substrate 11. A first encapsulant 13 is formed on the first substrate 11 for encapsulating the first electronic element 10 and has a plurality of openings 130 for exposing the conductive pads 111. A solder bump 114 is formed on each of the conductive pads 111 in the openings 130 of the first encapsulant 13. A plurality of solder balls 14 are formed on the conductive pads 112 of the second surface 11b of the first substrate 11.

The second package structure 1b has a second substrate 12, a plurality of second electronic elements 15a, 15b bonded to the second substrate 12 through wire bonding, and a second encapsulant 16 formed on the second substrate 12 for encapsulating the second electronic elements 15a, 15b. The second substrate 12 is stacked on the solder bumps 114 of the first package structure 1a so as to be electrically connected to the conductive pads 111 of the first substrate 11 through the solder bumps 114.

Therefore, in the PoP structure 1, the solder bumps 114 are used for mechanical support and electrical connection between the first substrate 11 and the second substrate 12. However, as I/O count increases, if the package size does not change, the pitch between the solder bumps 114 must be reduced. As such, solder bridging easily occurs between the solder bumps 114, thereby reducing the product yield and reliability and hindering fabrication of fine-pitch products.

Further, after a reflow process, the solder bumps 114 can have large differences in volume and height from one another. That is, size variation of the solder bumps 114 is not easy to control. As such, defects may occur to solder joints and result in a poor electrical connection quality. For example, during the reflow process, the solder bumps 114 easily collapse and deform under pressure of the second substrate 12. Therefore, solder bridging easily occurs between adjacent solder bumps 114, thereby reducing the electrical connection quality. Furthermore, the solder bumps 114 arranged in a grid array may have a poor coplanarity. Consequently, uneven stresses can be applied on the solder joints, thus easily leading to a tilted bonding between the two package structures 1a, 1b and even causing an offset of the solder joints.

Moreover, since only the solder bumps 114 provide mechanical support between the first and second package structures 1a, 1b and a large gap d is formed between the first and second package structures 1a, 1b, warpage easily occurs to the first and second substrates 11, 12.

Therefore, how to overcome the above-described drawbacks has become critical.

SUMMARY OF THE INVENTION

In view of the above-described drawbacks, the present invention provides a package on package (PoP) structure, which comprises: a packaging substrate having a plurality of conductive bumps, wherein each of the conductive bumps has a metal ball and a solder material covering the metal ball; and an electronic element having a plurality of conductive posts, wherein the electronic element is stacked on the packaging substrate by correspondingly bonding the conductive posts to the conductive bumps, each of the conductive posts and the corresponding conductive bump forming a conductive element.

The above-described structure can further comprise an encapsulant formed between the electronic element and the packaging substrate for encapsulating the conductive elements.

The above-described structure can further comprise an encapsulant formed on the packaging substrate for encapsulating the conductive bumps and having a plurality of openings for exposing the conductive bumps to be bonded with the conductive posts.

The present invention further provides a method for fabricating a package on package (PoP) structure, which comprises the steps of: providing a packaging substrate having a plurality of conductive bumps and an electronic element having a plurality of conductive posts, wherein each of the conductive bumps has a metal ball and a solder material covering the metal ball; and correspondingly bonding the conductive posts to the conductive bumps so as to stack the electronic element on the packaging substrate, wherein each of the conductive posts and the corresponding conductive bump form a conductive element.

After correspondingly bonding the conductive posts to the conductive bumps, the above-described method can further comprise forming an encapsulant between the electronic element and the packaging substrate for encapsulating the conductive elements.

Before correspondingly bonding the conductive posts to the conductive bumps, the above-described method can further comprise forming an encapsulant on the packaging substrate for encapsulating the conductive bumps and forming a plurality of openings in the encapsulant for exposing the conductive bumps.

In the above-described structure and method, each of the conductive bumps can further have an insulating body formed inside the metal ball.

In the above-described structure and method, the electronic element can be another packaging substrate or a semiconductor element.

In the above-described structure and method, a semiconductor element can be disposed on the packaging substrate. The semiconductor element can be positioned between the electronic element and the packaging substrate. Further, an underfill can be formed between the packaging substrate and the semiconductor element.

According to the present invention, after forming the conductive elements, the conductive posts can come into contact with the metal balls of the corresponding conductive bumps.

Therefore, the present invention facilitates the stacking process through butt joint of the conductive posts and the metal balls. Since size variation of the metal balls and the conductive posts is easy to control, the prevent invention overcomes the conventional drawbacks of tilted bonding and joint offset.

Further, the present invention not only uses the conductive elements as a mechanical support between the electronic element and the packaging substrate, but also fills the gap between the electronic element and the packaging substrate with the encapsulant, thus preventing warpage of the electronic element and the packaging substrate.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2E are schematic cross-sectional views showing a method for fabricating a PoP structure 2 according to a first embodiment of the present invention.

Figure 2A:
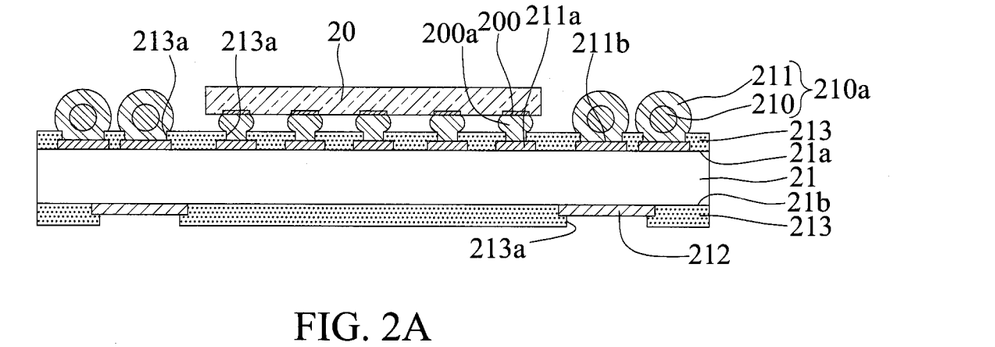
FIGS. 2A to 2E are schematic cross-sectional views showing a method for fabricating a PoP structure according to a first embodiment of the present invention, wherein FIG. 2A' shows another embodiment of FIG. 2A.

Referring to FIG. 2A, a packaging substrate 21 having a plurality of conductive bumps 210a is provided. Each of the conductive bumps 210a has a metal ball 210 and a solder material 211 covering the metal ball 210 for facilitating a subsequent stacking process.

In the present embodiment, the metal ball 210 is made of Cu, Sn—Pb or Sn—Ag. If the metal ball 210 is made of Cu, the solder material 211 is made of Ni—Sn. Otherwise, if the metal ball 210 is made of Sn—Pb or Sn—Ag, the solder material 211 is made of Sn—Pb or Sn—Ag having a composition ratio different from that of the metal ball 210.

The packaging substrate 21 has a first surface 21a and a second surface 21b opposite to the first surface 21a. The first surface 21a of the packaging substrate 21 has a plurality of first conductive pads 211a and a plurality of second conductive pads 211b, and the second surface 21b of the packaging substrate 21 has a plurality of third conductive pads 212. An insulating layer 213, such as a solder mask layer, is formed on the first surface 21a and the second surface 21b of the packaging substrate 21, and a plurality of openings 213a are formed in the insulating layer 213 for exposing the first conductive pads 211a, the second conductive pads 211b and the third conductive pads 212.

The conductive bumps 210a are formed on the exposed second conductive pads 211b. A semiconductor element 20 having a plurality of electrode pads 200 is flip-chip disposed on the packaging substrate 21. That is, the electrode pads 200 of the semiconductor element 20 are electrically connected to the first conductive pads 211a through a plurality of solder bumps 200a. The semiconductor element 20 can be an active element or a passive element. In an embodiment, a plurality of semiconductor elements 20 can be provided, which can be active elements, passive elements or a combination thereof. The active elements are, for example, chips. The passive elements are, for example, resistors, capacitors and inductors.

In another embodiment, referring to FIG. 2A', each of the conductive bumps 210a' further has an insulating body 210', such as a plastic ball, formed inside the metal ball 210.

Figure 2B:
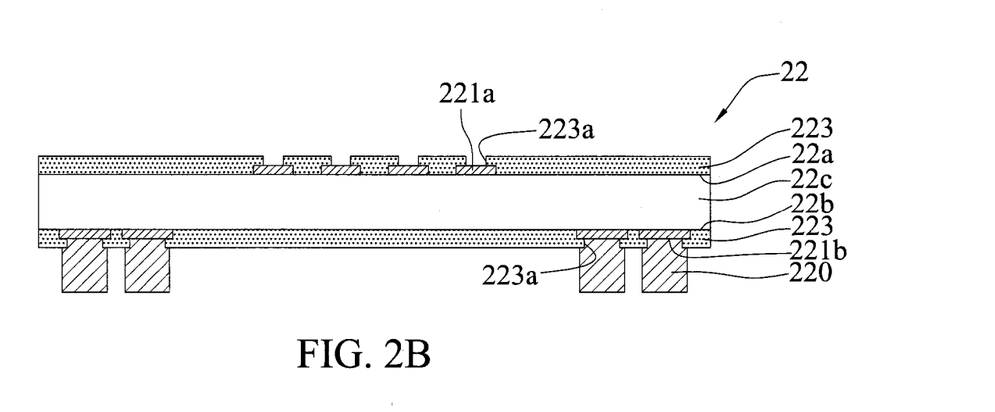

Referring to FIG. 2B, an electronic element 22 having a plurality of conductive posts 220 is provided. The conductive posts 220 can be made of copper.

In the present embodiment, the electronic element 22 is a packaging substrate, which has a base 22c having a third surface 22a and a fourth surface 22b opposite to the third surface 22a. The third surface 22a has a plurality of fourth conductive pads 221a and the fourth surface 22b has a plurality of fifth conductive pads 221b. An insulating layer 223, such as a solder mask layer, is formed on the third surface 22a and the fourth surface 22b of the base 22c and a plurality of openings 223a are formed in the insulating layer 223 for exposing the fourth conductive pads 221a and the fifth conductive pads 221b.

Further, the conductive posts 220 are formed on the exposed fifth conductive pads 221b by electroplating.

Figure 2C:
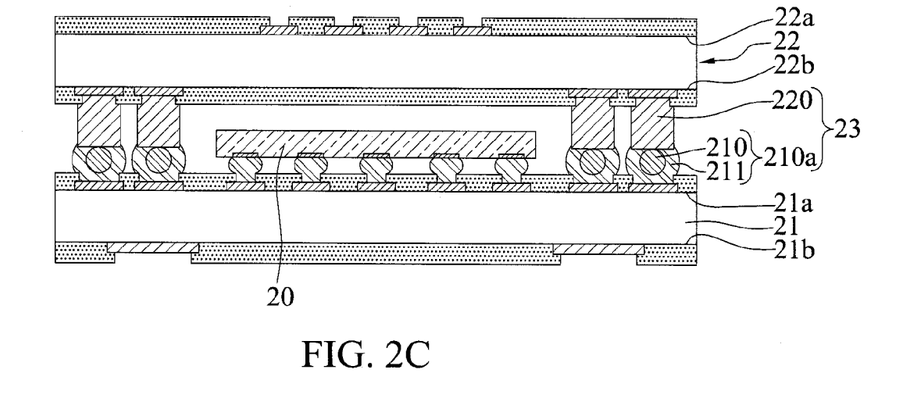

Referring to FIG. 2C, the electronic element 22 is stacked on the packaging substrate 21 by correspondingly bonding the conductive posts 220 to the conductive bumps 210a. The semiconductor element 20 is positioned between the electronic element 22 and the packaging substrate 21. Further, the solder material 211 is reflowed such that each of the conductive posts 220 and the corresponding conductive bump 210a form a conductive element 23.

In the present embodiment, the electronic element 22 is electrically connected to the packaging substrate 21 through the conductive elements 23. The conductive posts 220 are in contact with the metal balls 210 of the corresponding conductive bumps 210a.

Figure 2D:
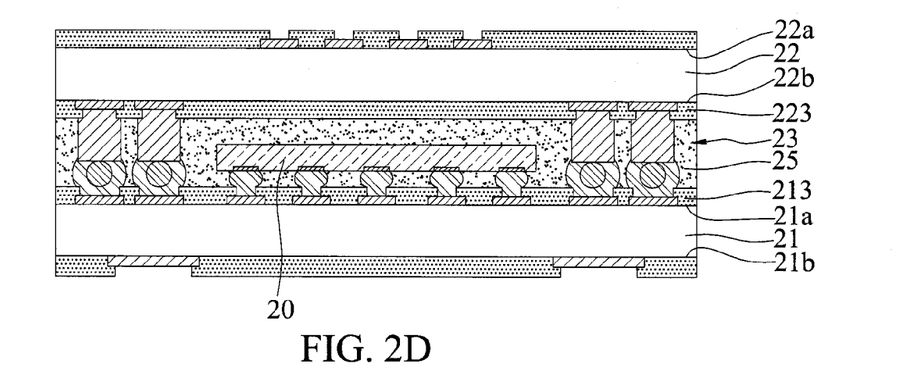

Referring to FIG. 2D, by performing such as a molding process, an encapsulant 25 is formed between the first surface 21a of the packaging substrate 21 (i.e., the insulating layer 213) and the fourth surface 22b of the electronic element 22 (i.e., the insulating layer 223) for encapsulating the conductive elements 23 and the semiconductor element 20.

Figure 2E:
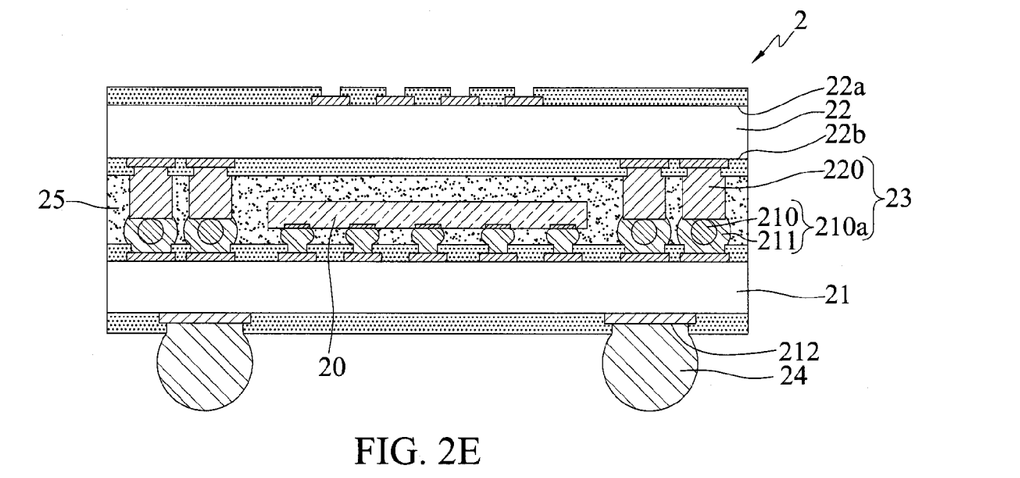

Referring to FIG. 2E, a plurality of solder balls 24 are formed on the third conductive pads 212 of the packaging substrate 21.

Therefore, through butt joint of the conductive posts 220 and the metal balls 210, the present invention causes solder joints to be formed only at the bottom of the conductive posts 220 after the reflow process and thereby reduces the size of the solder joints. Therefore, the present invention prevents solder bridging from occurring, increases the product yield and meets the fine pitch requirement.

Further, since the size variation of the conductive posts 220 and the metal balls 210 is easy to control, good joints can be formed between the electronic element 22 and the packaging substrate 21 so as to improve the electrical connection quality. Further, the conductive elements 23 arranged in a grid array have a good coplanarity. Hence, the present invention can easily control the height of the product and also prevents a tilted bonding between the packaging substrate 21 and the electronic element 22.

Furthermore, the present invention not only uses the conductive elements 23 for mechanical support between the packaging substrate 21 and the electronic element 22, but also fills the gap between the packaging substrate 21 and the electronic element 22 with the encapsulant 25 so as to prevent warpage of the packaging substrate 21 and the electronic element 22.

Figure 3A:
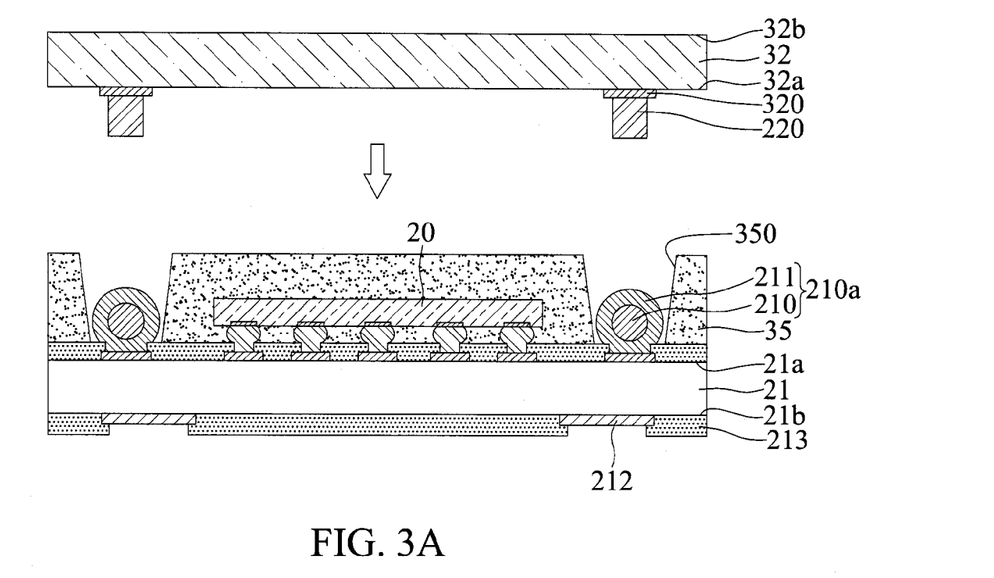
FIGS. 3A to 3B' are schematic cross-sectional views showing a method for fabricating a PoP structure according to a second embodiment of the present invention, wherein FIGS. 3A' and 3B' show other embodiments of FIGS. 3A and 3B, respectively.
Figure 3B:
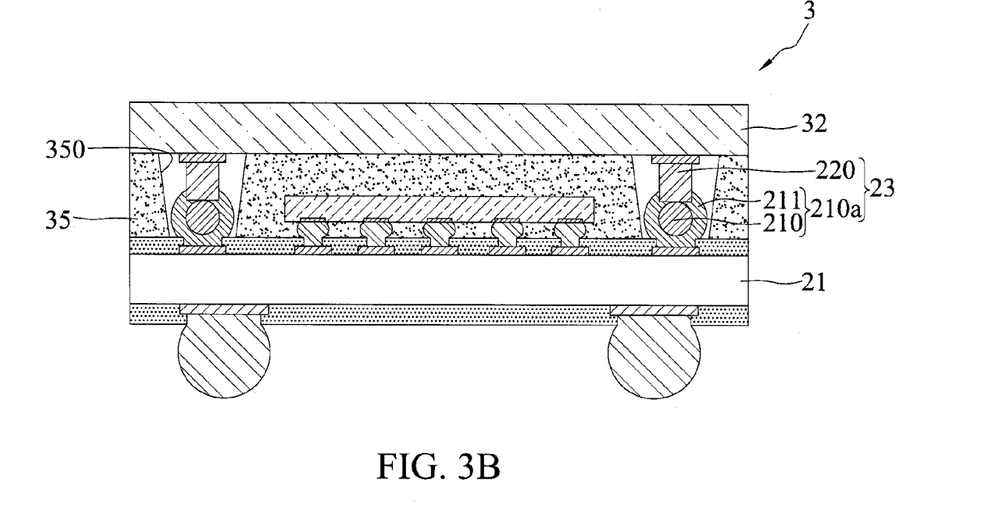

FIGS. 3A to 3B are schematic cross-sectional views showing a method for fabricating a PoP structure 3 according to a second embodiment of the present invention. The present embodiment mainly differs from the first embodiment in the process of forming the encapsulant.

Referring to FIG. 3A, before the stacking process, an encapsulant 35 is formed on the packaging substrate 21 for encapsulating the semiconductor element 20 and the conductive bumps 210a. The encapsulant 35 is also formed between the packaging substrate 21 and the semiconductor element 20. Then, a plurality of openings 350 are formed in the encapsulant 35 for exposing the conductive bumps 210a.

Alternatively, referring to FIG. 3A', an underfill 36 can be formed between the packaging substrate 21 and the semiconductor element 20 first and then the encapsulant 35 is formed on the packaging substrate 21 for encapsulating the semiconductor element 20 and the conductive bumps 210a.

In the present embodiment, the electronic element 32 is a semiconductor element. The electronic element 32 can be an active element, such as a chip, or a passive element, such as a resistor, a capacitor or an inductor. The electronic element has an active surface 32a having a plurality of electrode pads 320 and an inactive surface 32b opposite to the active surface 32a. A plurality of conductive posts 220 are formed on the electrode pads 320, respectively.

Referring to FIG. 3B, the electronic element 32 is stacked on the packaging substrate 21 by correspondingly bonding the conductive posts 220 to the conductive bumps 210a. Through a reflow process, each of the conductive posts 220 and the corresponding conductive bump 210a form a conductive element 23.

In an embodiment, referring to FIG. 3B', the semiconductor element 20 can be omitted to form a PoP structure 3'.

Therefore, the present invention first forms the encapsulant 35 to encapsulate the conductive bumps 210a and then forms the openings 350 in the encapsulant 35 for exposing top surfaces of the conductive bumps 210a, As such, during the stacking process, the present invention achieves a preferred isolation effect between the conductive elements 23 through the encapsulant 35.

The present invention further provides a PoP structure 2, 3, 3', which has: a packaging substrate 21 having a plurality of conductive bumps 210a, and an electronic element 22, 32 having a plurality of conductive posts 220.

Each of the conductive bumps 210a has a metal ball 210 and a solder material 211 covering the metal ball 210. The electronic element 22, 32 is stacked on the packaging substrate 21 by correspondingly bonding the conductive posts 220 to the conductive bumps 210a. Each of the conductive posts 220 and the corresponding conductive bump 210a form a conductive element 23.

The electronic element 22, 32 can be another packaging substrate or a semiconductor element. The conductive posts 220 can come into contact with the metal balls 210 of the corresponding conductive bumps 210a.

In an embodiment, each of the conductive bumps 210a' further has an insulating body 210' formed inside the metal ball 210.

In an embodiment, the PoP structure 2, 3 further has a semiconductor element 20 disposed on the packaging substrate 21. The semiconductor element 20 is positioned between the electronic element 22, 32 and the packaging substrate 21. Further, an underfill 36 can be formed between the packaging substrate 21 and the semiconductor element 20.

In an embodiment, the PoP structure 2 further has an encapsulant 25 formed between the electronic element 22 and the packaging substrate 21 for encapsulating the conductive elements 23.

In an embodiment, the PoP structure 3, 3' further has an encapsulant 35 formed on the packaging substrate 21 for encapsulating the conductive bumps 210a and having a plurality of openings 350 for exposing the conductive bumps 210a to be bonded with the conductive posts 220.

Therefore, the present invention facilitates the stacking process through butt joint of the conductive posts and the metal balls. Since size variation of the metal balls and the conductive posts is easy to control, the prevent invention can ensure vertical stacking and facilitate good joints to be formed between the stack structures, thereby preventing solder bridging from occurring and improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package on package (PoP) structure, comprising:
 a packaging substrate having a plurality of conductive bumps, wherein each of the conductive bumps has a metal ball and a solder material covering the metal ball; and
 an electronic element having an active surface with a plurality of electrode pads, an inactive surface opposite to the active surface, and a plurality of conductive posts formed on and in contact with the electrode pads, wherein the electronic element is stacked on the packaging substrate by correspondingly bonding the conductive posts to the conductive bumps, each of the conductive posts and the corresponding conductive bump forming a conductive element.

2. The structure of claim 1, wherein each of the conductive bumps further has an insulating body formed inside the metal ball.

3. The structure of claim 1, wherein the electronic element is another packaging substrate or a semiconductor element.

4. The structure of claim 1, further comprising a semiconductor element disposed on the packaging substrate.

5. The structure of claim 4, wherein the semiconductor element is positioned between the electronic element and the packaging substrate.

6. The structure of claim 4, further comprising an underfill formed between the packaging substrate and the semiconductor element.

7. The structure of claim 1, further comprising an encapsulant formed between the electronic element and the packaging substrate for encapsulating the conductive elements.

8. The structure of claim 1, further comprising an encapsulant formed on the packaging substrate for encapsulating the conductive bumps and having a plurality of openings for exposing the conductive bumps to be bonded with the conductive posts.

9. A method for fabricating a package on package (PoP) structure, comprising the steps of:
providing a packaging substrate having a plurality of conductive bumps and an electronic element having an active surface with a plurality of electrode pads, an inactive surface opposite to the active surface, and a plurality of conductive posts formed on and in contact with the electrode pads, wherein each of the conductive bumps has a metal ball and a solder material covering the metal ball; and
correspondingly bonding the conductive posts to the conductive bumps so as to stack the electronic element on the packaging substrate, wherein each of the conductive posts and the corresponding conductive bump form a conductive element.

10. The method of claim 9, wherein each of the conductive bumps further has an insulating body formed inside the metal ball.

11. The method of claim 9, wherein the electronic element is another packaging substrate or a semiconductor element.

12. The method of claim 9, further comprising disposing a semiconductor element on the packaging substrate.

13. The method of claim 12, wherein the semiconductor element is positioned between the electronic element and the packaging substrate.

14. The method of claim 12, further comprising forming an underfill between the packaging substrate and the semiconductor element.

15. The method of claim 9, after correspondingly bonding the conductive posts to the conductive bumps, further comprising forming an encapsulant between the electronic element and the packaging substrate for encapsulating the conductive elements.

16. The method of claim 9, before correspondingly bonding the conductive posts to the conductive bumps, further comprising forming an encapsulant on the packaging substrate for encapsulating the conductive bumps and forming a plurality of openings in the encapsulant for exposing the conductive bumps.

* * * * *